(12) United States Patent
Watanabe et al.

(10) Patent No.: US 7,031,785 B2
(45) Date of Patent: Apr. 18, 2006

(54) METHOD OF PRODUCTION CONTROL AND METHOD OF MANUFACTURING ELECTRONIC APPARATUS

(75) Inventors: Kazuhiro Watanabe, Kawasaki (JP); Yuuichi Kubo, Kawasaki (JP); Hideo Ishii, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 181 days.

(21) Appl. No.: 10/390,836

(22) Filed: Mar. 18, 2003

(65) Prior Publication Data
US 2003/0182008 A1 Sep. 25, 2003

(30) Foreign Application Priority Data
Mar. 19, 2002 (JP) .............................. 2002-075423

(51) Int. Cl.
*G06F 19/00* (2006.01)

(52) U.S. Cl. ........................................ 700/99; 700/103
(58) Field of Classification Search ................. 700/96, 700/99, 100, 101, 102–107
See application file for complete search history.

(56) References Cited

U.S. PATENT DOCUMENTS 5,880,960 A * 3/1999 Lin et al. ...................... 700/99

2003/0028276 A1* 2/2003 Adair et al. .................. 700/99
2003/0105542 A1* 6/2003 Arnold et al. .............. 700/102
2003/0195648 A1* 10/2003 Bacin et al. ................ 700/100

FOREIGN PATENT DOCUMENTS

| JP | 01-244607 | 9/1989 |
| JP | 06-069087 | 3/1994 |
| JP | 11-066157 | 3/1999 |
| JP | 2001-273023 | 10/2001 |

\* cited by examiner

*Primary Examiner*—Zoila Cabrera
(74) *Attorney, Agent, or Firm*—Greer, Burns & Crain, Ltd.

(57) ABSTRACT

The invention relates to a method of production control that is preferably used for manufacture of electronic apparatus such as liquid crystal displays and provides a method of production control that makes it possible to set a feasible quantity to be processed. In a method of production control for a production line having a plurality of production steps, a tentative target quantity to be processed is set for a major production step; the tentative target quantity to be processed is set as a target quantity to be processed when the quantity of work in process that can be actually processed is equal to or greater than the tentative target quantity to be processed; and the quantity of work in process that can be processed is set as the target quantity to be processed when the quantity of work in process that can be processed is smaller than the tentative target quantity to be processed.

12 Claims, 15 Drawing Sheets

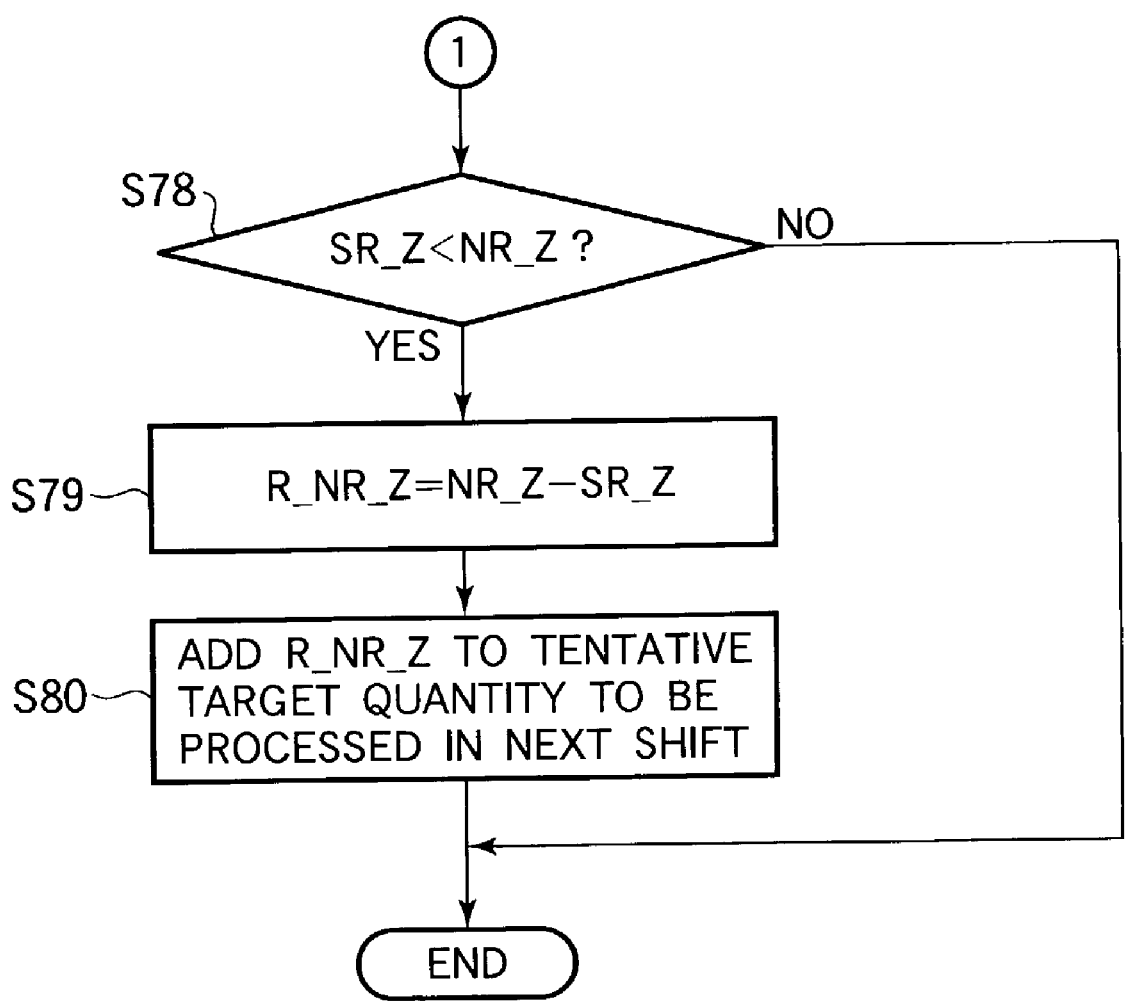

FIG.15

| PRODUCTION STEP | PRODUCT A |  |  |  |  | PRODUCT B |  |  |  |  |
|---|---|---|---|---|---|---|---|---|---|---|
|  | SHIPPING PLAN P | ACTUAL QUANTITY SHIPPED D | BALANCE ΣB | QUANTITY TO BE RECOVERED R' | TARGET FOR SHIPMENT NR_Z | SHIPPING PLAN P | ACTUAL QUANTITY SHIPPED D | BALANCE ΣB | QUANTITY TO BE RECOVERED R' | TARGET FOR SHIPMENT NR_Z |
| SHIFT(n−5) | ap1 | ad1 | aa1 |  |  | bp1 | bd1 | ba1 |  |  |
| SHIFT(n−4) | ap2 | ad2 | aa2 |  |  | bp2 | bd2 | ba2 |  |  |
| SHIFT(n−3) | ap3 | ad3 | aa3 |  |  | bp3 | bd3 | ba3 |  |  |
| SHIFT(n−2) | ap4 | ad4 | aa4 |  |  | bp4 | bd4 | ba4 |  |  |
| SHIFT(n−1) | ap5 | ad5 | aa5 |  |  | bp5 | bd5 | ba5 |  |  |
| SHIFTn | ap6 |  |  | ar1 | ap6+ar1 | bp6 |  |  | br1 | bp6+br1 |
| SHIFT(n+1) | ap7 |  |  | ar2 | ap7+ar2 | bp7 |  |  | br2 | bp7+br2 |
| SHIFT(n+2) | ap8 |  |  | ar3 | ap8+ar3 | bp8 |  |  | br3 | bp8+br3 |
| SHIFT(n+3) | ap9 |  |  | ar4 | ap9+ar4 | bp9 |  |  |  | bp9 |
| SHIFT(n+4) | ap10 |  |  |  | ap10 | bp10 |  |  |  | bp10 |

METHOD OF PRODUCTION CONTROL AND METHOD OF MANUFACTURING ELECTRONIC APPARATUS

BACKGROUND OF THE INVENTION

1. Field of the Invention

The present invention relates to a method of production control and, more particularly, to a method of production control that is preferably used for the manufacture of electronic apparatus such as liquid crystal displays.

2. Description of the Related Art

In a Japanese Patent Application (Japanese Patent Laid-Open No. 2001-273023 (hereinafter referred to as "Article 1"), the applicant has proposed a method of production control for production steps that can give and receive capabilities of each other by sharing apparatus in general. According to the method of production control, a load ratio of each of the production steps that is the ratio of the number of products to be processed at the production step to the product processing capability of the production step is first obtained as the ratio of planned cumulative production at the production step to cumulative capability of the production step throughout an operating period that is the object of a medium-term production plan. Next, an optimum ratio of use of each apparatus at each production step is calculated such that the production steps have an equal load ratio. A processing schedule for each production step is determined such that the ratio of use of each apparatus at each production step substantially equals the optimum ratio of use during the operating period.

Article 1 has proposed a method of production control to be used for a group of production steps belonging to a production line for two ore more product types when there is a condition that the history of an apparatus used for processing one product type at one of the production steps limits processing of one product type at another of the group of production steps to an certain apparatus (such a condition is hereinafter referred to as "condition that limits use of apparatus"). According to this method of production control, the optimum ratio at which each apparatus is used at each production step and for each product type is calculated such that it has an equal load ratio with respect to cumulative processing during an operating period that is the object of a medium-term production plan, thereby reflecting the optimum ratio of use in a short-term production plan.

In general, the method of production control proposed in Article 1 makes it possible to level loads between production steps that can give and receive capabilities of each other by sharing apparatus throughout an operating period that is the object of a medium-term production plan. However, since actual work in process is not considered in calculating a target for processing, a problem arises in that the target quantity to be processed can not be achieved because of shortage of work in process.

According to the method of production control proposed in Article 1, when products are categorized into series of products based on the apparatus that are used or scheduled to be used at the first production step under a condition limiting use of apparatus, processing can be carried out with an optimum ratio if work in process belonging to each series of products is close to the optimum ratio of use of each of the apparatus. However, when work in process is concentrated in any of the series of products, a problem arises in that the quantity that can be actually processed will be significantly smaller than the target quantity to be processed.

When a production step under a condition that limits use of apparatus is a bottleneck production step, in order to maximize processing at the bottleneck production step, it is desirable to feed products to the bottleneck production step from the preceding production step according to a target quantity to be processed for each series of apparatus. However, no existing method of scheduling has allowed maximization of processing at a bottleneck production step in such a way.

In a production line on which product types that are introduced on a batch basis or discrete basis are mingled with product types that are continuously introduced, a problem arises in that a leveled target quantity to be processed that is calculated based on a load ratio leveled throughout a period under a medium-term production plan is not in conformity with a target for processing of the product types that are introduced on a discrete basis.

SUMMARY OF THE INVENTION

The invention provides a method of production control that makes it possible to set a feasible maximum target quantity to be processed.

A tentative target quantity to be processed at a major production step is set in advance. When the quantity of work in process that can be actually processed is equal to or greater than the tentative target quantity to be processed, the tentative target quantity to be processed is set as a target quantity to be processed. When the quantity of work in process that can be actually processed is smaller than the tentative target quantity to be processed, the quantity of work in process that can be actually processed is set as a target quantity to be processed. This makes it possible to reflect actual work in process in the calculation of a target of processing and thereby makes it possible to prevent the problem in that a target quantity to be processed cannot be achieved because of shortage of work in process.

When a group of production steps share a group of apparatus and can give and receive capabilities of each other through the sharing of apparatus as disclosed in Article 1, a tentative target quantity to be processed is set such that a load ratio of each of the group of production steps is leveled between the apparatus or throughout an operating period that is the object of scheduling. This makes it possible to perform processing with the highest efficiency with respect to both of the apparatus and the period under the production plan.

When a condition that limits use of apparatus exist, products are categorized into product types depending on the apparatus used or scheduled to be used at the first production step under the condition limiting use of apparatus, and the tentative target quantity to be processed and/or target quantity to be processed is determined for each of the product types.

At a production step under a condition that limits use of apparatus, a tentative target quantity to be processed is set for each product type on both of an assumption that only one product type flows through the production step and an assumption that a mixture of product types flows through the production step, and a target quantity to be processed for each product type is determined such that the ratio of the target quantity to be processed of each product type is equal to the ratio of the quantity of work in process that can be actually processed for the product type, such that the sum of the target quantities to be processed of the product types is at a maximum value that is equal to or smaller than the sum of the tentative target quantities to be processed, and such that the target quantity to be processed of each product type is at a maximum value that is equal to or smaller than the tentative target quantity to be processed of the product type. This makes it possible to minimize the difference between a tentative target total quantity to be processed and the quantity of products that can be actually processed even when actual work in process is extremely concentrated on any product type and even when work in process for each product type is close to the optimum use ratio of each apparatus.

When a condition that limits use of apparatus exists and a production step under the condition limiting use of apparatus is a bottleneck production step, each product type in a quantity corresponding to a tentative target quantity to be processed of the product type at the production step minus the quantity of work in process for the product type at the production step is fed with priority from the production step that precedes the production step for which the tentative target quantity to be processed for the product type has been determined, which makes it possible to maximize the processing at the bottleneck production step.

Further, on a production line on which product types that are introduced on a batch basis or discrete basis are mingled with product types that are continuously introduced, a tentative target quantity to be processed of a product type introduced on a batch basis or discrete basis is made equal to the quantity of products that form one batch of the product type; a tentative target quantity to be processed of another product type is set at a tentative target quantity to be processed for each product type on an assumption that only one product type flows through the production step; a tentative target quantity to be processed is set based on the quantity of products to form a batch for at least one of the product types; a tentative target quantity to be processed for each product type is set for the other product types on an assumption that only one product type flows through the production step; and a tentative target total quantity to be processed that is the sum of the product types processed at the production step is set such that load ratios of apparatus that are shared at the production step or between production steps including that production step are leveled between the apparatus and throughout an operating period that is the object of scheduling. This makes it possible to optimize processing of both of the product types that are introduced on a batch basis or discrete basis and the other product types that are continuously introduced.

BRIEF DESCRIPTION OF THE DRAWINFGS

FIG. 14 is the flow chart showing the method of production control according to the eighth embodiment of the invention; and FIG. 15 illustrates the method of production control according to the eighth embodiment of the invention.

DESCRIPTION OF THE PREFERRED EMBODIMENTS

Figure 1:
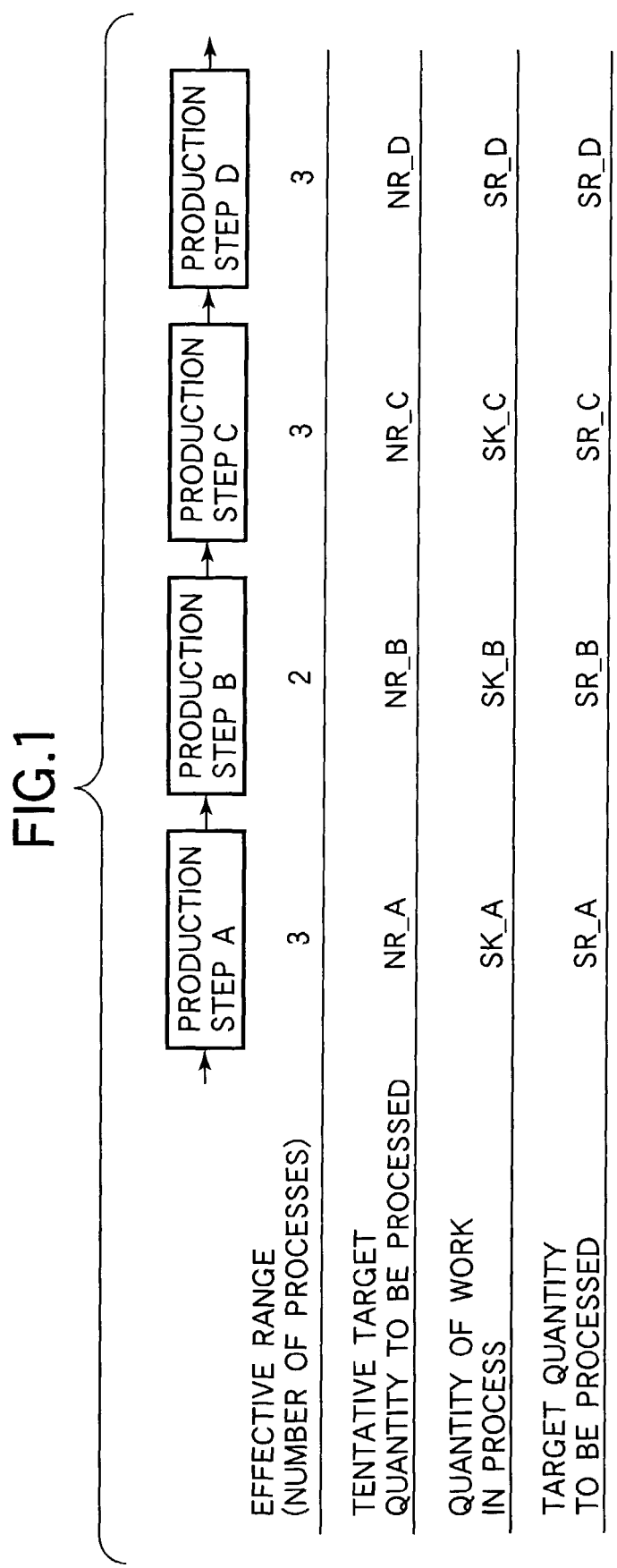
FIG. 1 illustrates a method of production control according to a first embodiment of the invention.
Figure 2:
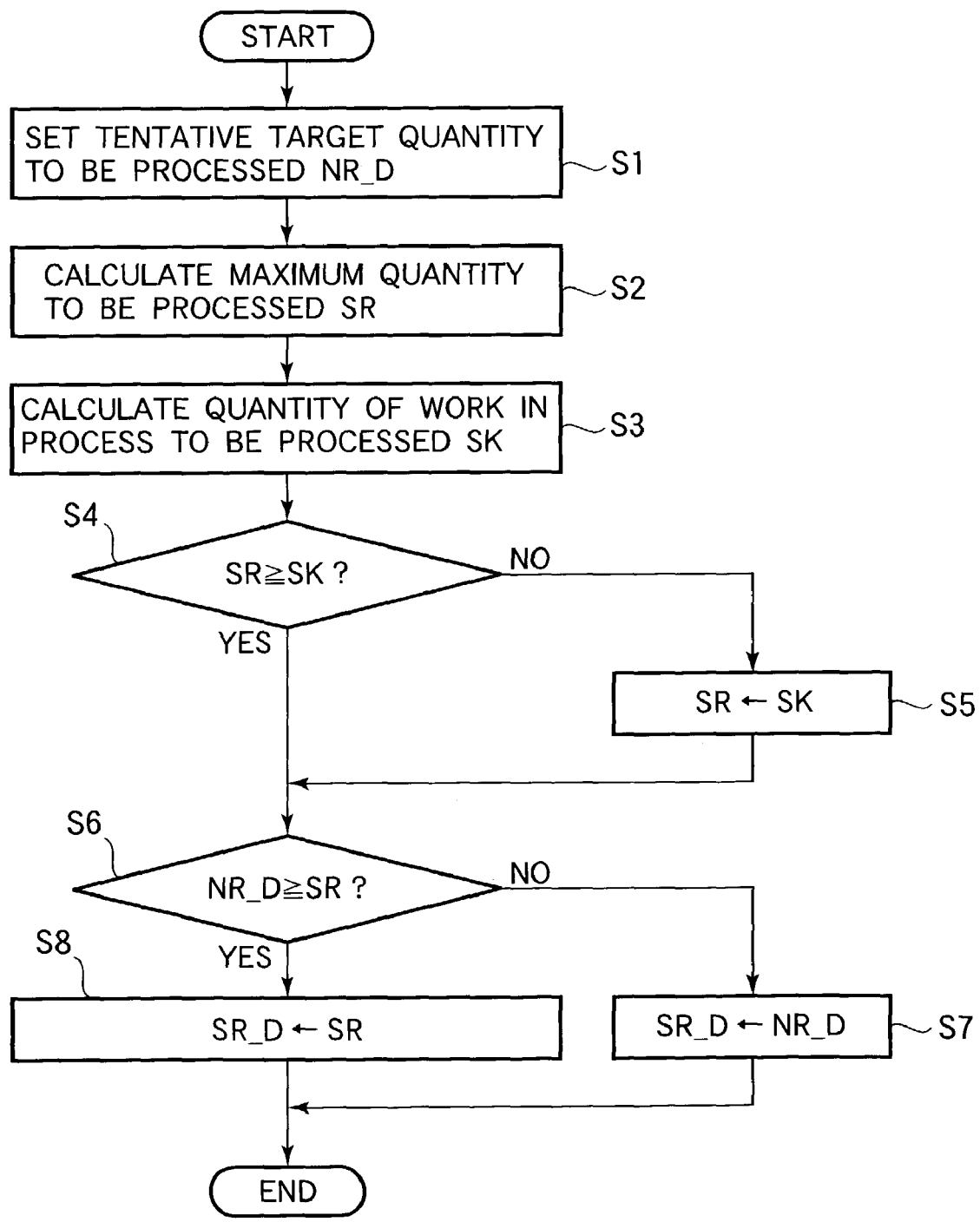
FIG. 2 is a flow chart showing the method of production control according to the first embodiment of the invention.

A method of production control according to a first embodiment of the invention will now be described with reference to FIGS. 1 and 2. FIG. 1 illustrates a production line on which the method of production control according to the present embodiment is used. As shown in FIG. 1, four production steps A, B, C and D are connected in the order listed to form a part of the production line. Let us assume that effective ranges (numbers of processes), tentative target quantities to be processed, quantities of work in process, and target quantities to be processed have already been set for the production steps A to C. FIG. 2 is a flow chart showing the method of production control according to the present embodiment. As shown in FIG. 2, a tentative target quantity to be processed NR_D for the major production step D is set first (step S1).

Next, a maximum quantity to be processed SR is determined (step S2). When a target quantity to be processed SR_D at the production step D is set, the maximum value of the target quantity is the sum of the quantity of work in process SK_D at the production step D and a target quantity to be processed SR_C at the preceding production step C. Thus, the maximum quantity to be processed SR is given by the following equation.

$$SR=SR\_C+SK\_D$$

Next, a quantity of work in process to be processed SK is determined (step S3). A range of work in process that places a limit on setting of the target quantity to be processed SR_D at the production step D is set based on the standard lead time of each production step. Here, the three production steps preceding the production step D are set as an effective range of the production step D taking the standard lead time of each of the production steps into consideration. That is, it is assumed that quantities of work in process SK_A to SK_D at the production step A to D in the range covering the production step D and the three preceding production steps can be actually processed at the production step D. Thus, the following equation is obtained.

$$SK=SK\_A+SK\_B+SK\_C+SK\_D$$

Next, the maximum quantity to be processed SR and the quantity of work in process to be processed SK are compared (step S4). When SK<SR, the maximum quantity to be processed SR can not be entirely processed because of limitations placed by the standard lead times within the effective range. Therefore, the maximum quantity to be processed SR is corrected such that SK equals SR (step S5). When SK≧SR, the maximum quantity to be processed SR is not corrected because it is subjected to no limitation in the effective range.

Next, the maximum quantity to be processed (the quantity of work in process that can be actually processed) SR and the tentative target quantity to be processed NR_D are compared (step S6). When NR_D<SR, since the maximum quantity to be processed SR is in the excess of the tentative target quantity to be processed NR_D, the maximum quantity to be processed SR cannot be entirely processed. This proves that the tentative target quantity to be processed NR_D is achievable. Therefore, the target quantity to be processed SR_D at the production step D is set as SR_D=NR_D (step S7). On the contrary, when NR_D≧SR, even the maximum quantity to be processed SR cannot satisfy the tentative target quantity to be processed NR_D. Therefore, the target quantity to be processed SR_D at the production step D is set as SR_D=SR (step S8).

The present embodiment makes it possible to check whether a tentative target quantity to be processed NR_D is achievable or not. Further, an achievable target quantity to be processed SR_D can be set by checking limitations placed by work in process and lead times in an effective range.

Figure 3:
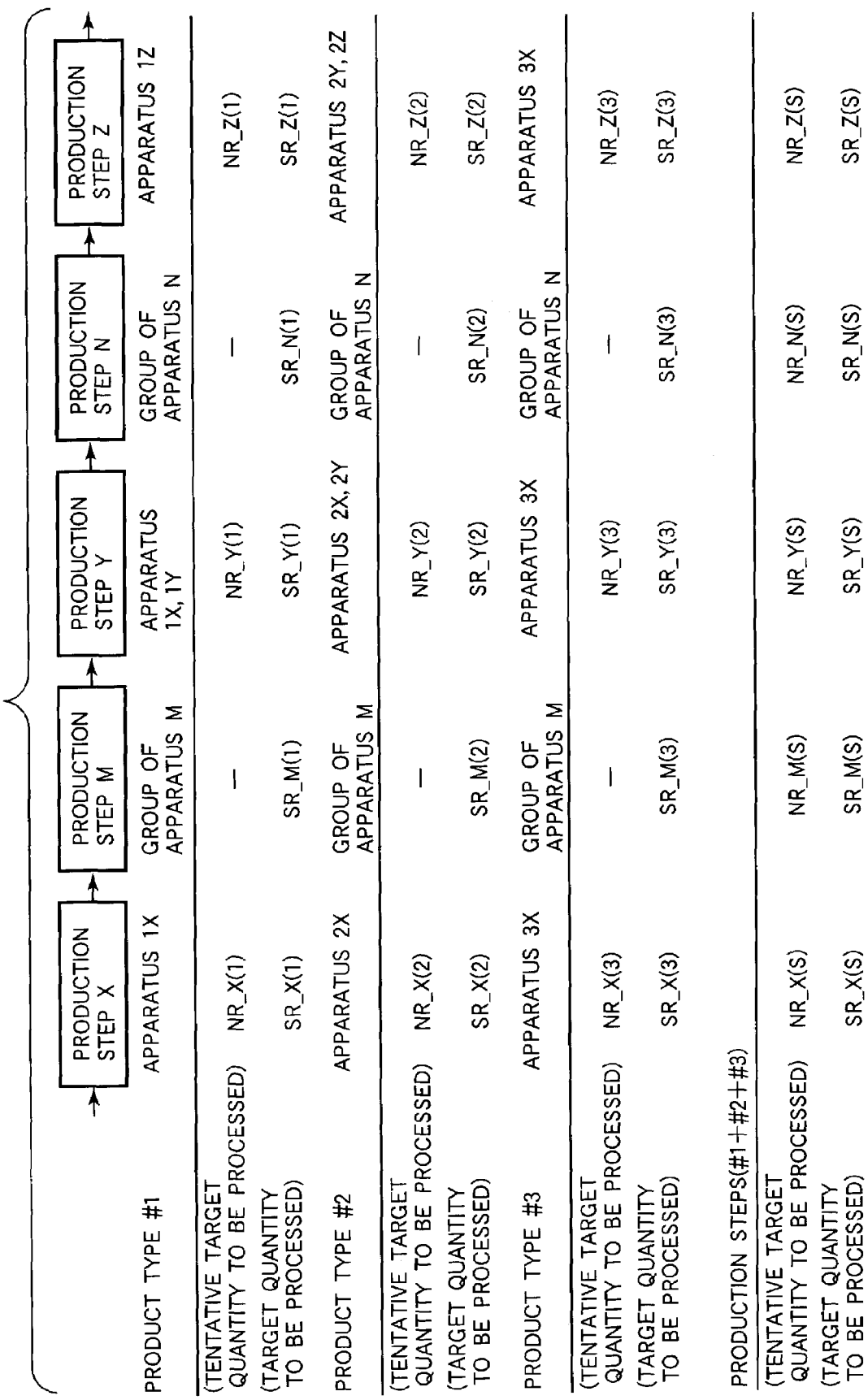
FIG. 3 illustrates a method of production control according to a second embodiment of the invention.

A method of production control according to a second embodiment of the invention will now be described with reference to FIGS. 3 and 4. FIG. 3 illustrates a production line on which the method of production control according to the present embodiment is used. As shown in FIG. 3, five production steps X, M, Y, N and Z form a part of the production line. For example, the production steps X, Y and Z are under the following condition that limits use of apparatus.

Products that have been processed by an apparatus 1X at the production step X must be processed by the apparatus 1X or an apparatus 1Y at the production step Y, and they must be processed by an apparatus 1Z at the production step Z. Hereinafter, a type of products that can be processed by the apparatus 1X, 1Y and 1Z only is referred to as "product type #1".

Products that have been processed by an apparatus 2X at the production step X must be processed by the apparatus 2X or an apparatus 2Y at the production step Y, and they must be processed by the apparatus 2Y or an apparatus 2Z at the production step Z. Hereinafter, a type of products that can be processed by the apparatus 2X, 2Y and 2Z only is referred to as "product type #2".

Products processed by an apparatus 3X at the production step X must be processed by the apparatus 3X again at the production step Y, and they must be processed by the apparatus 3X at the production step Z too. Hereinafter, a type of products that can be processed by the apparatus 3X only is referred to as "product type #3".

There is no condition that limits use of apparatus for the production steps M and N because they use respective groups of apparatus M and N on a shared basis. Therefore, tentative target quantities to be processed NR_M(S), and NR_N(S) are set for the entire production steps covering product types #1, #2 and #3, and target quantities to be processed SR_M(S) and SR_N(S) are determined based on them respectively through a procedure similar to that in the first embodiment.

For the production steps X, Y and Z, since there is a condition that limits use of apparatus, a target quantity to be processed is determined for each of the product types #1, #2 and #3. FIG. 4 is a flow chart showing a procedure for calculating a target quantity to be processed at a processing step under a condition that limits use of apparatus using the method of production control according to the present embodiment. As shown in FIG. 4, for example, at the production step X first, a tentative target quantity to be processed NR_X(1) of the product type #1, a tentative target quantity to be processed NR_X(2) of the product type #2 and a tentative target quantity to be processed NR_X(3) of the product type #3 (which are collectively referred to as "NR_X(1–3)" in FIG. 4) are set (step S11).

Figure 4:
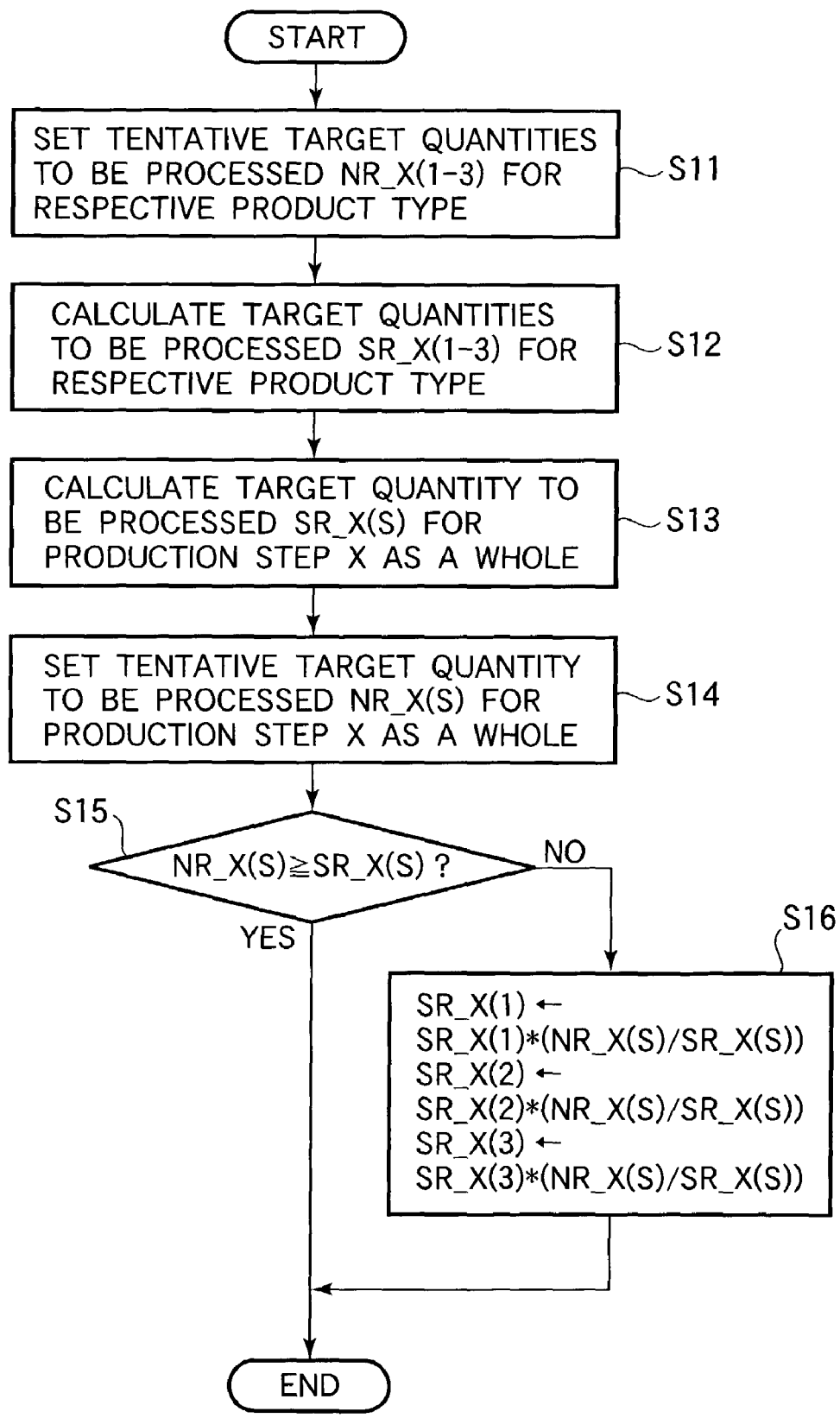
FIG. 4 is a flow chart showing the method of production control according to the second embodiment of the invention.

Then, target quantities to be processed SR_X(1), SR_X(2) and SR_X(3) (which are collectively referred to as "SR_X (1–3)" in FIG. 4) are calculated for the product types #1, #2 and #3, respectively through a procedure similar to that in the first embodiment (step S12).

Next, a target quantity to be processed SR_X(S) of the production step X as a whole is calculated using the following equation (step S13).

$$SR\_X(S)=SR\_X(1)+SR\_X(2)+SR\_X(3)$$

Next, a tentative target quantity to be processed NR_X(S) at the production step X as a whole is set (step S14). Next, the tentative target to be processed NR_X(S) and the target quantity to be processed SR_X(S) are compared (step S15). When NR_X(S)<SR_X(S), the target quantity to be processed SR_X(S) cannot be entirely processed. Therefore, the target quantities to be processed SR_X(1), SR_X(2) and SR_X(3) for the respective product types #1, #2 and #3 are corrected such that NR_X(S) equals SR_X(S) (step S16). The initial ratio between the target quantities to be processed SR_X(1), SR_X(2) and SR_X(3) is maintained. No correction is made when NR_X(S)≧SR_X(S). The target quantities to be processed SR_X(1), SR_X(2) and SR_X(3) for the respective product types #1, #2 and #3 can be calculated through the above-described procedure.

The present embodiment makes it possible to set feasible target quantities to be processed SR_X(1), SR_X(2) and SR_X(3) for respective product types #1, #2 and #3 at even a production step X that is under a condition that limits use of apparatus. Further, when a tentative target quantity to be processed NR_X(S) for the production step X as a whole is set, the target quantities to be processed SR_X(1), SR_X(2) and SR_X(3) for the respective product types #1, #2 and #3 can be set such that a target quantity to be processed SR_X(S) at the production step X as a whole is maximized within a limit placed by the tentative target quantity to be processed NR_X(S).

Figure 5:
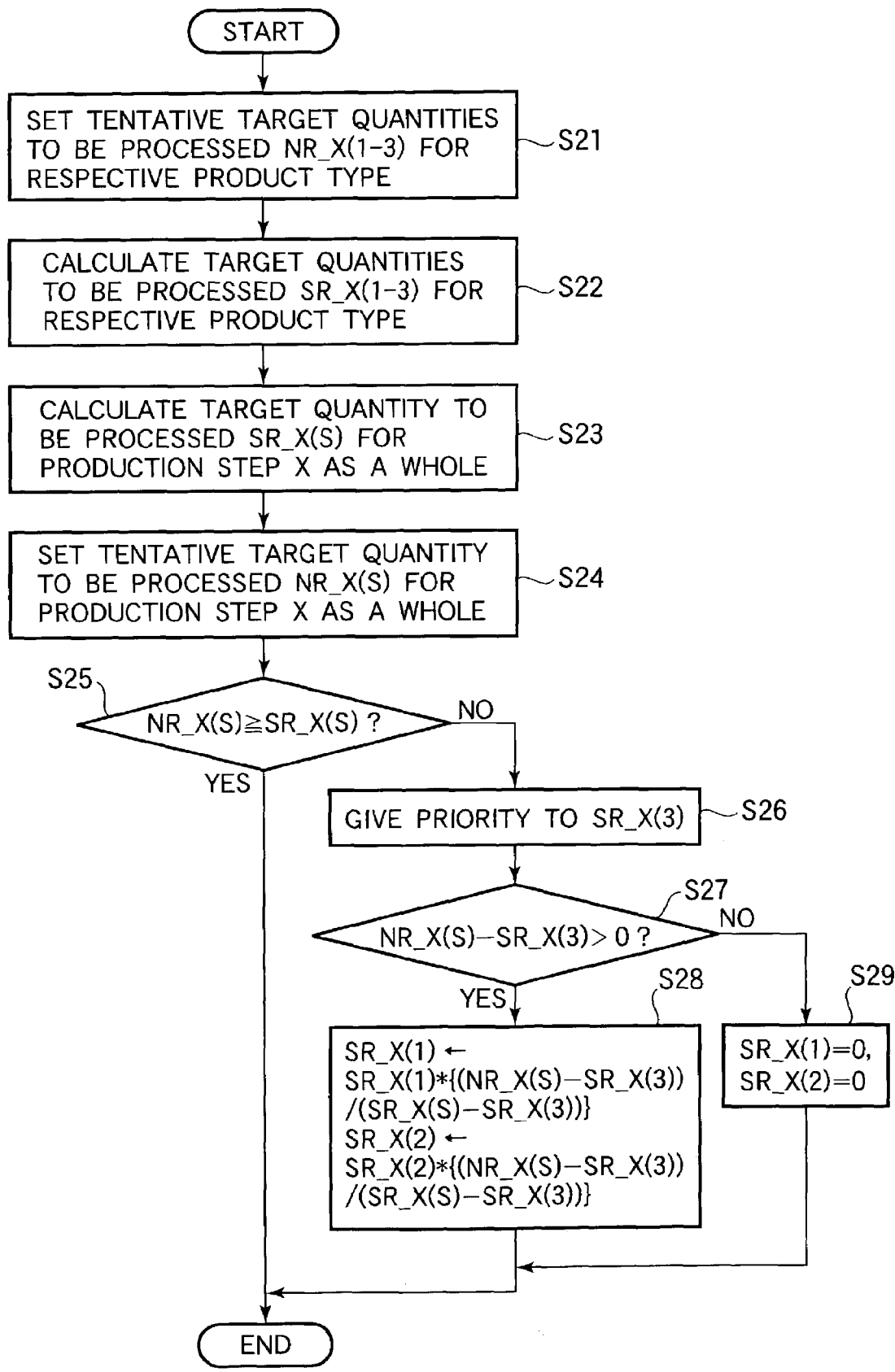
FIG. 5 is a flow chart showing a method of production control according to a third embodiment of the invention.

A method of production control according to a third embodiment of the invention will now be described with reference to FIG. 5. The present embodiment is on an assumption that there is a condition that limits use of apparatus similar to that in the second embodiment and that a batch process is performed on a product type #3. FIG. 5 is a flow chart showing the method of production control according to the present embodiment. No description will be made on steps S21 to S25 which are similar to steps S11 to S15 shown in FIG. 4. As shown in FIG. 5, when NR_X(S) <SR_X(S)at step S25, a target quantity to be processed SR_X(3) for the product type #3 to be batch-processed is achieved with priority (step S26).

Next, (NR_X(S)–SR_X(3)) is compared with 0 (step S27). When (NR_X(S)–SR_X(3))>0, SR_X(1) and SR_X (2) are corrected such that an initial ratio between those quantities is maintained (step S28). When (NR_X(S)–SR_X (3)) is not greater than 0, SR_X(1) is set equal to SR_X(2)=0 (step S29).

According to the present embodiment, even when a product type #3 to be batch-processed is mingled with other types of products #1 and #2, a target quantity to be processed can be set for each product type. By giving priority to the product type #3 to be batch-processed, batches can be easily formed, and a target quantity to be processed can be set such that a tentative target quantity to be processed of the apparatus is satisfied to the highest degree.

Figure 6:
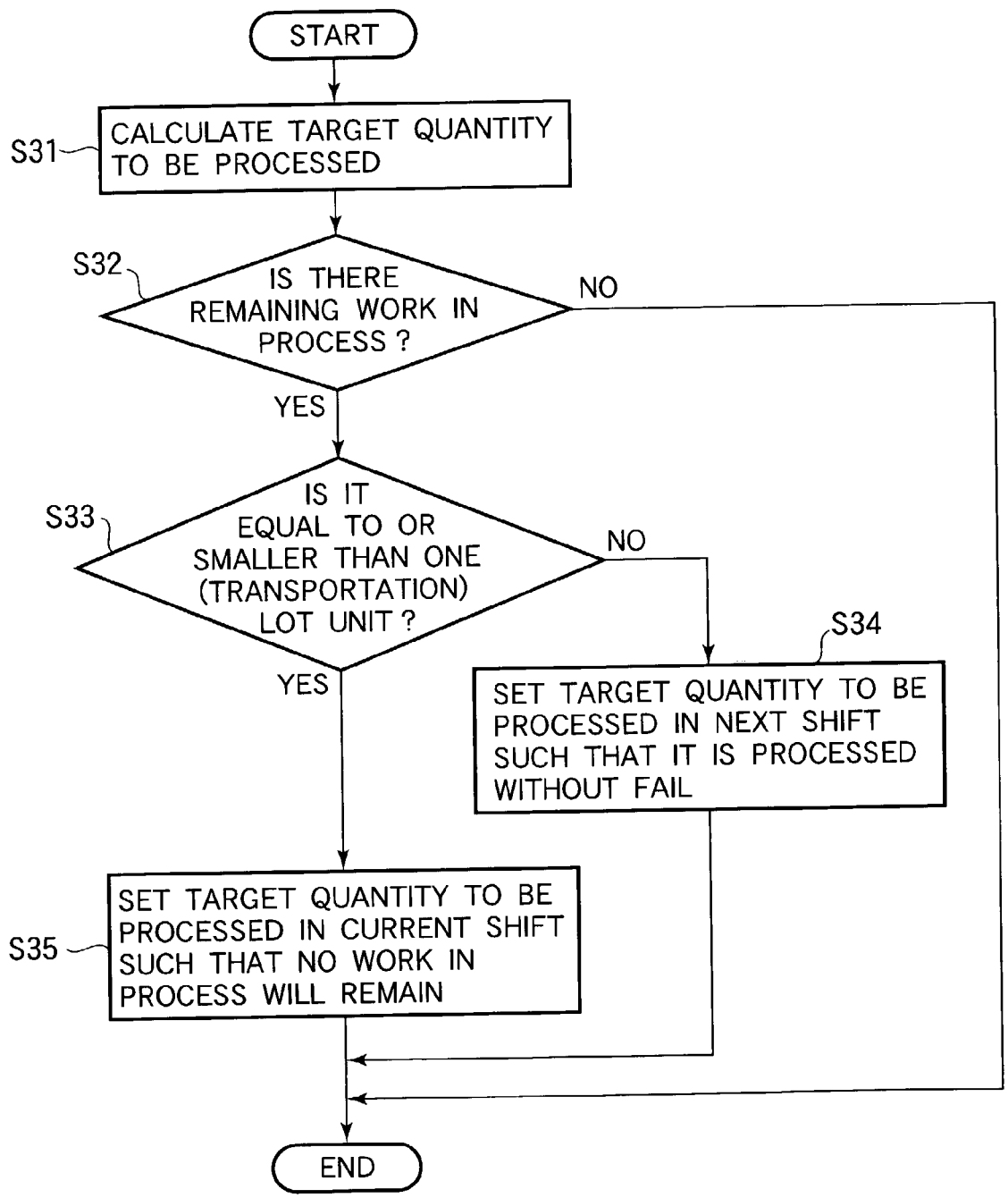
FIG. 6 is a flow chart showing a method of production control according to a fourth embodiment of the invention.

A method of production control according to a fourth embodiment of the invention will now be described with reference to FIG. 6. FIG. 6 is a flow chart showing a procedure for setting a target quantity to be processed by a production step at which a batch process is performed. As shown in FIG. 6, a target quantity to be processed is set first (step S31). Next, it is judged whether processing of work in process will be incomplete to still leave some work in process (step S32). When there is remaining work in process, it is judged whether the remaining work in process is equal to or smaller than one (transportation) lot unit (step S33). When the quantity of the remaining work in process is not equal to or smaller than one lot unit, a target quantity to be processed at the next shift is set such that the work in process will be processed during the next processing period (a twelve-hour shift, for example) without fail even if it is equal to or smaller than the batch size (a unit of products that are to be continuously processed by an apparatus) (step S34). When the quantity of the remaining work in process is equal to or smaller than one lot unit, a target quantity to be processed by the current shift is set such that no work in process remains though the batch size is exceeded (step S35).

The present embodiment makes it possible to set an appropriate target quantity to be processed even for a production step at which a batch process is performed.

Figure 7:
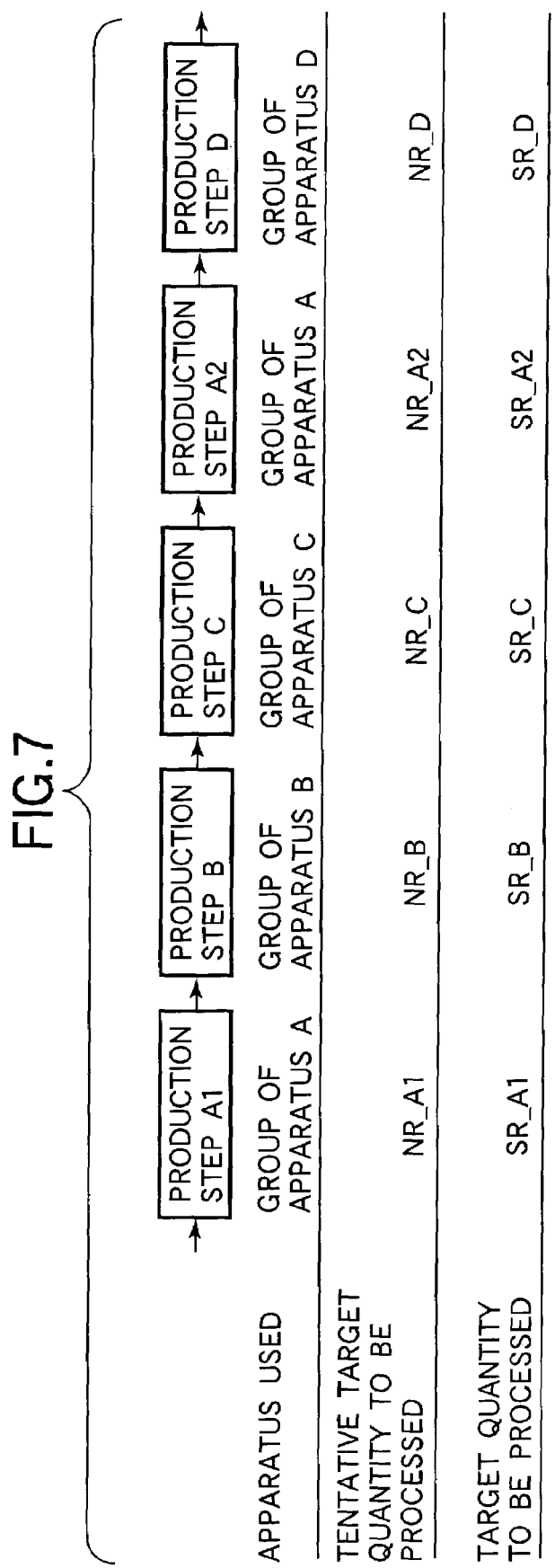
FIG. 7 illustrates a method of production control according to a fifth embodiment of the invention.

A method of production control according to a fifth embodiment of the invention will now be described with reference to FIGS. 7 and 8. FIG. 7 illustrates a production line on which the method of production control according to the present embodiment is used. As shown in FIG. 7, five production steps A1, B, C, A2 and D form a part of the production line. The production steps A1 and A2 share the same group of apparatus A to be able to give and receive capabilities of each other.

Figure 8:
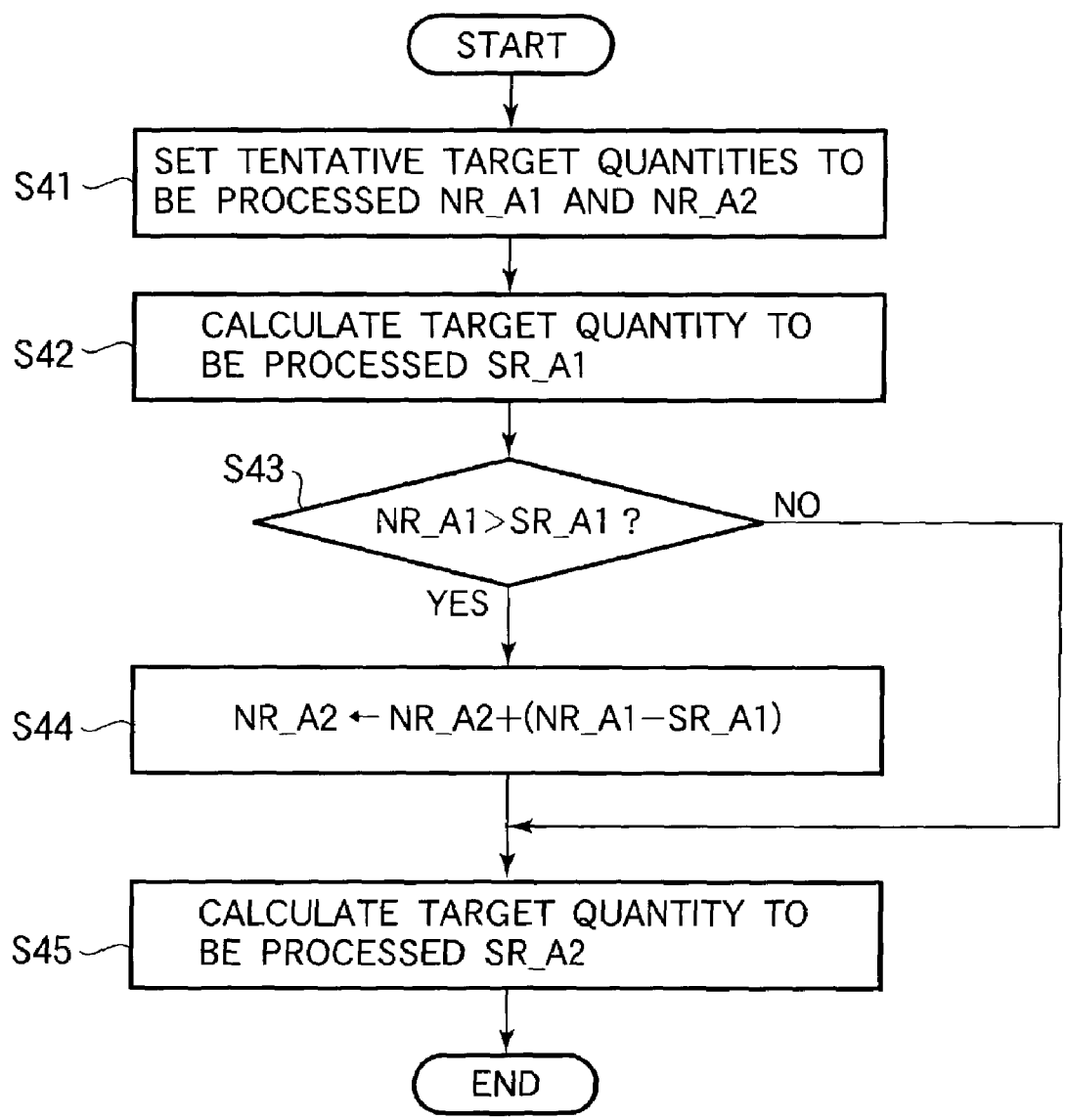
FIG. 8 is a flow chart showing the method of production control according to the fifth embodiment of the invention.

FIG. 8 is a flow chart showing a procedure for determining target quantities to be processed at the production steps A1 and A2 which share the same group of apparatus A using the method of production control according to the present embodiment. As shown in FIG. 8, a tentative target quantity to be processed NR_A1 and a tentative target quantity to be processed NR_A2 are set for the production steps A1 and A2, respectively (step S41). Next, a target quantity to be processed SR_A1 at the production step A1 is calculated based on the tentative target quantity to be processed NR_A1 at the production step A1 (step S42).

Next, the tentative quantity to be processed NR_A1 and the target quantity to be processed SR_A1 at the production step A1 are compared (step S43). When NR_A1>SR_A1, the difference between the tentative target quantity to be processed NR_A1 and the target quantity to be processed SR_A1 is allocated to the production step A2 to be added to the tentative target quantity to be processed NR_A2 at the production step A2 (step S44), and the procedure proceeds to step S45. When NR_A1 is not greater than SR_A1 at the step S43, the procedure directly proceeds to step S45. At step S45, a target quantity to be processed SR_A2 at the production step A2 is calculated based on the tentative target quantity to be processed NR_A2. The same procedure is repeated when there are other production steps between which a tentative target quantity to be processed can be transferred. The target quantities to be processed SR_A1 and SR_A2 at the production steps A1 and A2 that share the same group of apparatus A are thus determined.

According to the present embodiment, tentative target quantities to be processed NR_A1 and NR_A2 are redistributed between the plurality of production steps A1 and A2 that share the same group of apparatus A, which makes it possible to set target quantities to be processed such that a maximum tentative target quantity to be processed is set among the production steps as well as at production step A2.

Figure 9:
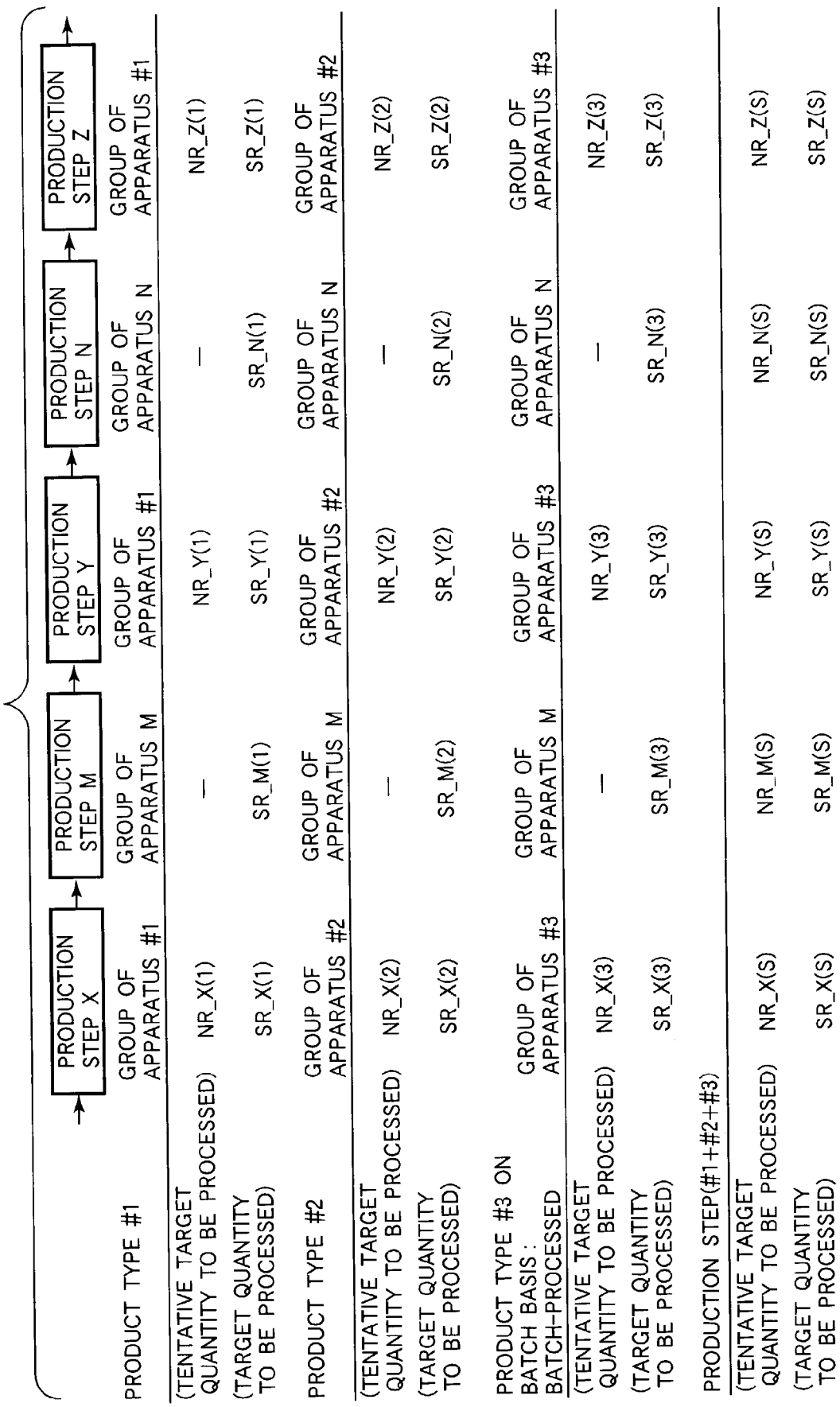
FIG. 9 illustrates a method of production control according to a sixth embodiment of the invention.

A method of production control according to a sixth embodiment of the invention will now be described with reference to FIGS. 9 and 10. FIG. 9 illustrates the method of production control according to the present embodiment. As shown in FIG. 9, five production steps X, M, Y, N and Z form a part of a production line. The production steps X, Y and Z share the same group of apparatus #1, #2 or #3. For example, the production steps X, Y and Z are under the following condition that limits use of apparatus. Products that have been processed by the group of apparatus #1 at the production step X must be processed by the group of apparatus #1 at the production steps Y and Z again. Products that have been processed by the group of apparatus #2 at the production step X must be processed by the group of apparatus #2 at the production steps Y and Z again. A product type #3 is processed on a batch basis.

Figure 10:
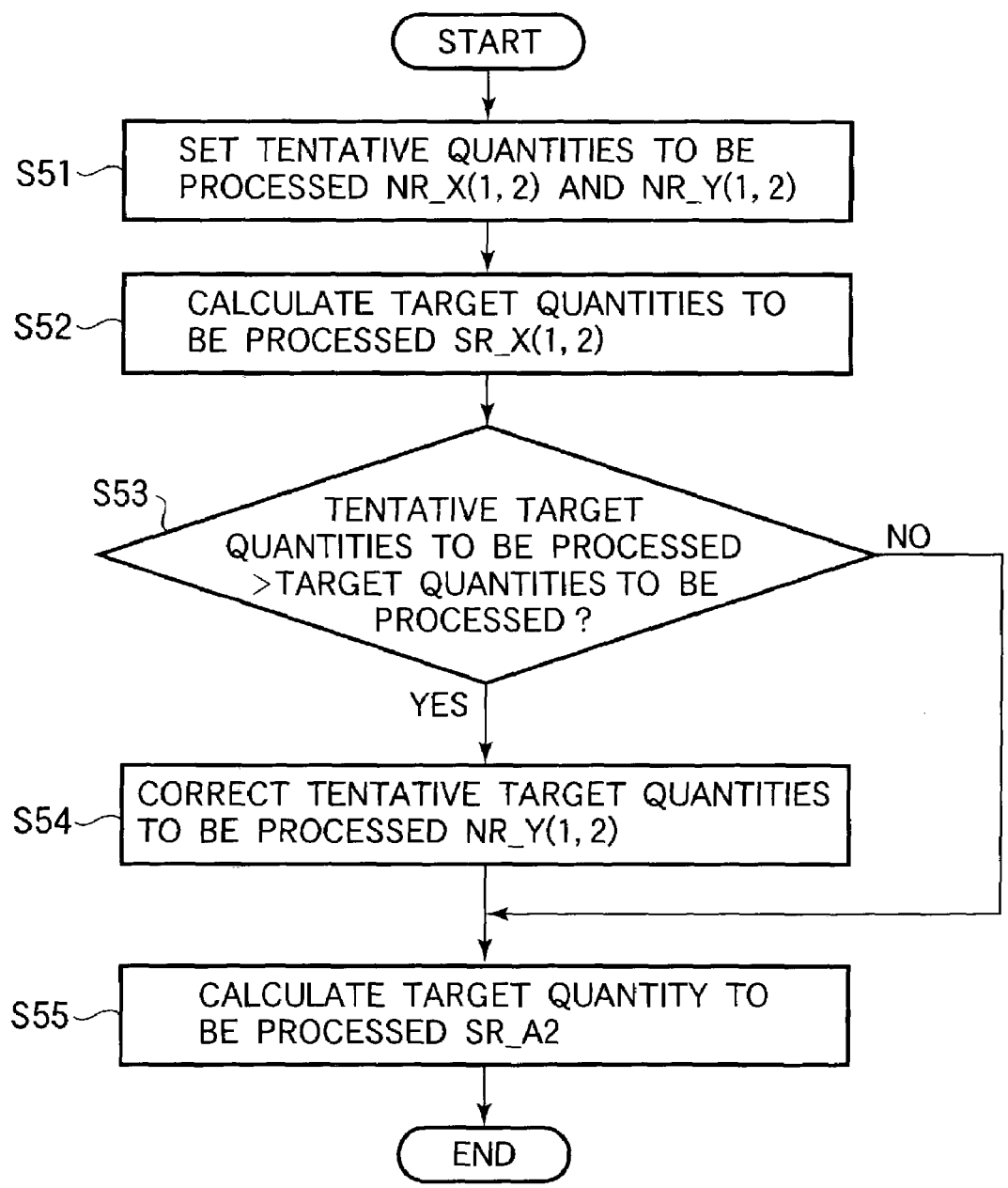
FIG. 10 is a flow chart showing the method of production control according to the sixth embodiment of the invention.

FIG. 10 is a flow chart showing a procedure for determining target quantities to be processed at the production steps X and Y using the method of production control according to the present embodiment. As shown in FIG. 10, a tentative target quantity to be processed NR_X(1) for a product type #1 and a tentative target quantity to be processed NR_Y(2) for a product type #2 at the production step X (which are collectively referred to as "NR_X(1,2)" in FIG. 10) are set first, and a tentative target quantity to be processed NR_Y(1) for the product type #1 and a tentative target quantity to be processed NR_Y(2) for the product type #2 at the production step Y (which are collectively referred to as "NR_Y(1,2)" in FIG. 10) are set (step S51).

Next, a target quantity to be processed SR_X(1) for the product type #1 and a target quantity to be processed SR_X(2) for the product type #2 at the production step X (which are collectively referred to as "SR_X(1,2)" in FIG. 10) are calculated based on the tentative target quantities to be processed NR_X(1) and NR_X(2) at the production step X respectively (step S52). Next, the tentative target quantity to be processed and the target quantity to be processed for each of the product types #1 and #2 at the production step X are compared (step S53). When the tentative target quantity to be processed for each of the product types #1 and #2 is greater than the target, quantity to be processed, the difference between the tentative quantity to be processed and the target quantity to be processed is allocated to the production step Y for that product type to be added to the tentative target quantity to be processed at the production step Y (step S54), and the procedure proceeds to step S55. When the tentative target quantity to be processed is not greater than the target quantity to be processed for both of the product types #1 and #2 at step S53, the procedure directly proceeds to step S55. At step S55, target quantities to be processed SR_Y(1) and SR_Y(2) at the production step A2 are calculated based on the tentative target quantities to be processed NR_Y(1) and NR_Y(2), respectively.

For the product type #3 that is batch-processed, the transfer of a tentative target quantity to be processed as described above does not occur, and tentative target quantities to be processed NR_X(3) and NR_Y(3) and target quantities to be processed SR_X(3) and SR_Y(3) are determined for the production steps X and Y, respectively.

According to the present embodiment, when there is a conditions that limits use of apparatus, tentative target quantities to be processed NR_X(1) and NR_Y(2) are redistributed, which makes it possible to set a target quantity to be processed such that a maximum tentative target quantity to be processed is set not only at the production step Y but also between the production steps.

Figure 11:
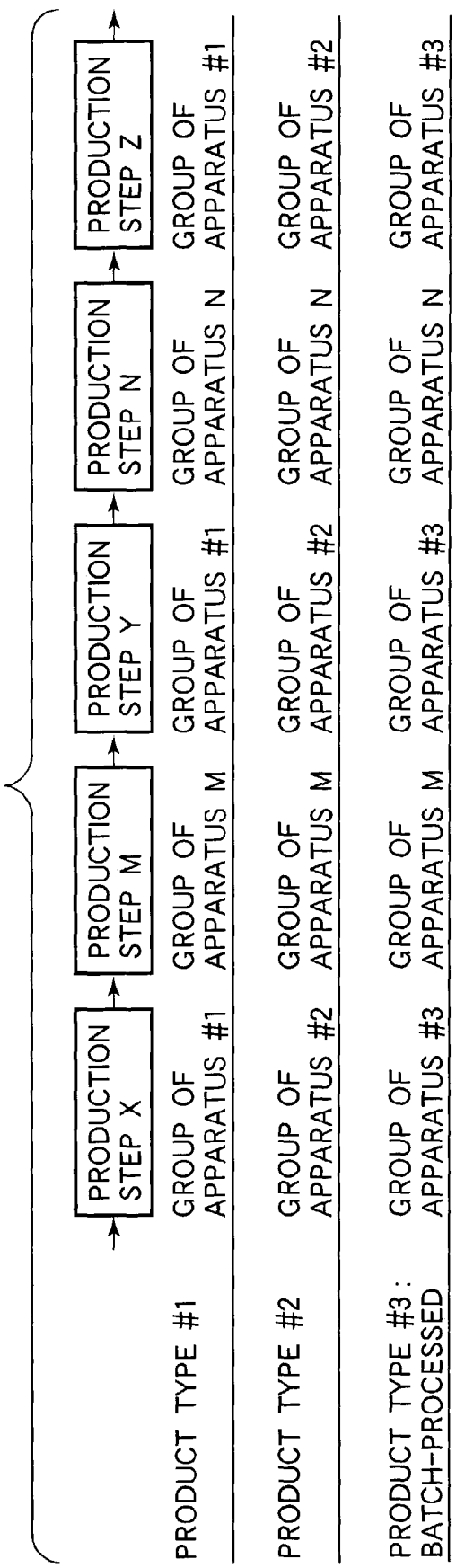
FIG. 11 illustrates a method of production control according to a seventh embodiment of the invention.

A method of production control according to a seventh embodiment of the invention will now be described with reference to FIGS. 11 and 12. FIG. 11 illustrates the method of production control according to the present embodiment. As shown in FIG. 11, five production steps X, M, Y, N and Z form a part of a production line. While groups of apparatus are shared and conditioned for limited use similarly to those at the production steps X, M, Y, N and Z shown in FIG. 9, the production step Y according to the present embodiment is a bottleneck production step.

Figure 12:
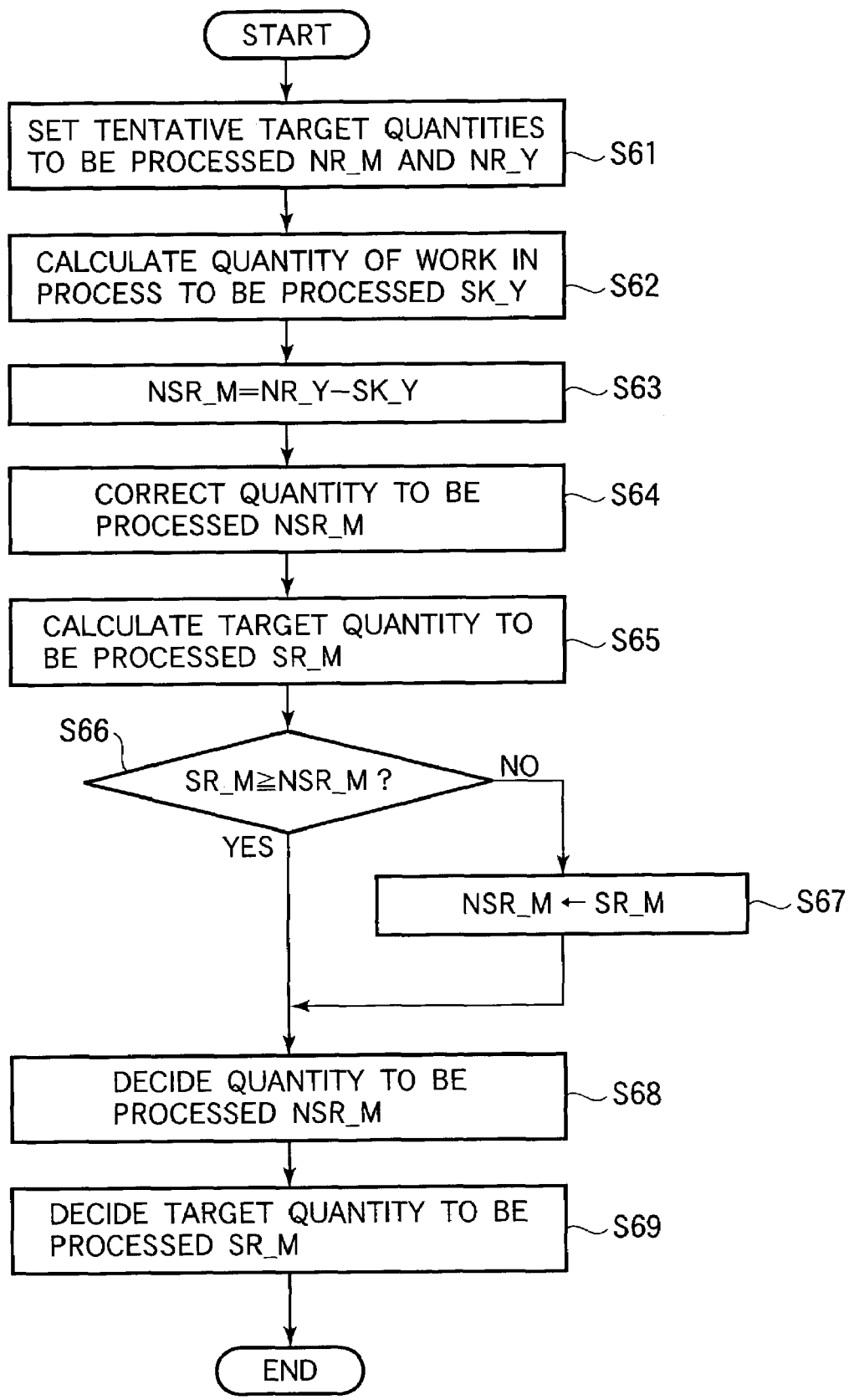
FIG. 12 is a flow chart showing the method of production control according to the seventh embodiment of the invention.

FIG. 12 is a flow chart showing a procedure for determining target quantities to be processed at the production steps M and Y using the method of production control according to the present embodiment. As shown in FIG. 12, a tentative target quantity to be processed NR_M at the production step M and a tentative target quantity to be processed NR_Y at the production step Y are set first (step S61). Next, the quantity of work in process SK_Y to be processed at the production step Y is calculated (step S62). Then, a quantity to be processed NSR_M at the preceding production step M is calculated based on the following equation such that it satisfies the tentative target quantity to be processed NR_Y at the production step Y (step S63). The calculation is carried out for each type of products when there is a condition that limits use of apparatus.

$$NSR\_M = NR\_Y - SK\_Y$$

Next, a correction is made as done at steps S4 and S5 in FIG. 2 with the quantity to be processed NSR_M at the production step M assumed to be a tentative target quantity to be processed (step S64). Then, a target quantity to be processed SR_M at the production step M is calculated using steps S6 to S8 in FIG. 2 when there is no condition that limits use of apparatus and using steps S16 and S17 in FIG. 4 or steps S25 to S28 in FIG. 5 when there is a condition that limits use of apparatus (step S65).

Next, the target quantity to be processed SR_M and the quantity to be processed NSR_M at the production step M are compared (step S66). When SR_M is not equal to or greater than NSR_M, the procedure proceeds to step S67 to correct the quantity to be processed NSR_M such that NSR_M equals SR_M. When SR_M is equal to or greater than NSR_M, the procedure proceeds to step S68.

Next, the quantity to be processed NSR_M at the production step M is decided and booked as a quantity to be included in the target quantity to be processed SR_M (step S68). Then, the target quantity to be processed SR_M at the production step M is decided (step S69). At this time, when the target quantity to be processed is not reached after booking the quantity to be processed NSR_M, the target quantity to be processed SR_M is decided to fill such room.

According to the present embodiment, when a production step Y is a bottleneck production step, a target quantity to be processed SR_M at a production step M preceding the same is set with priority as a quantity of products that is required for maximizing a target quantity to be processed SR_Y at the production step Y. This makes it possible to maximize the quantity processed at the bottleneck production step.

Figure 13:
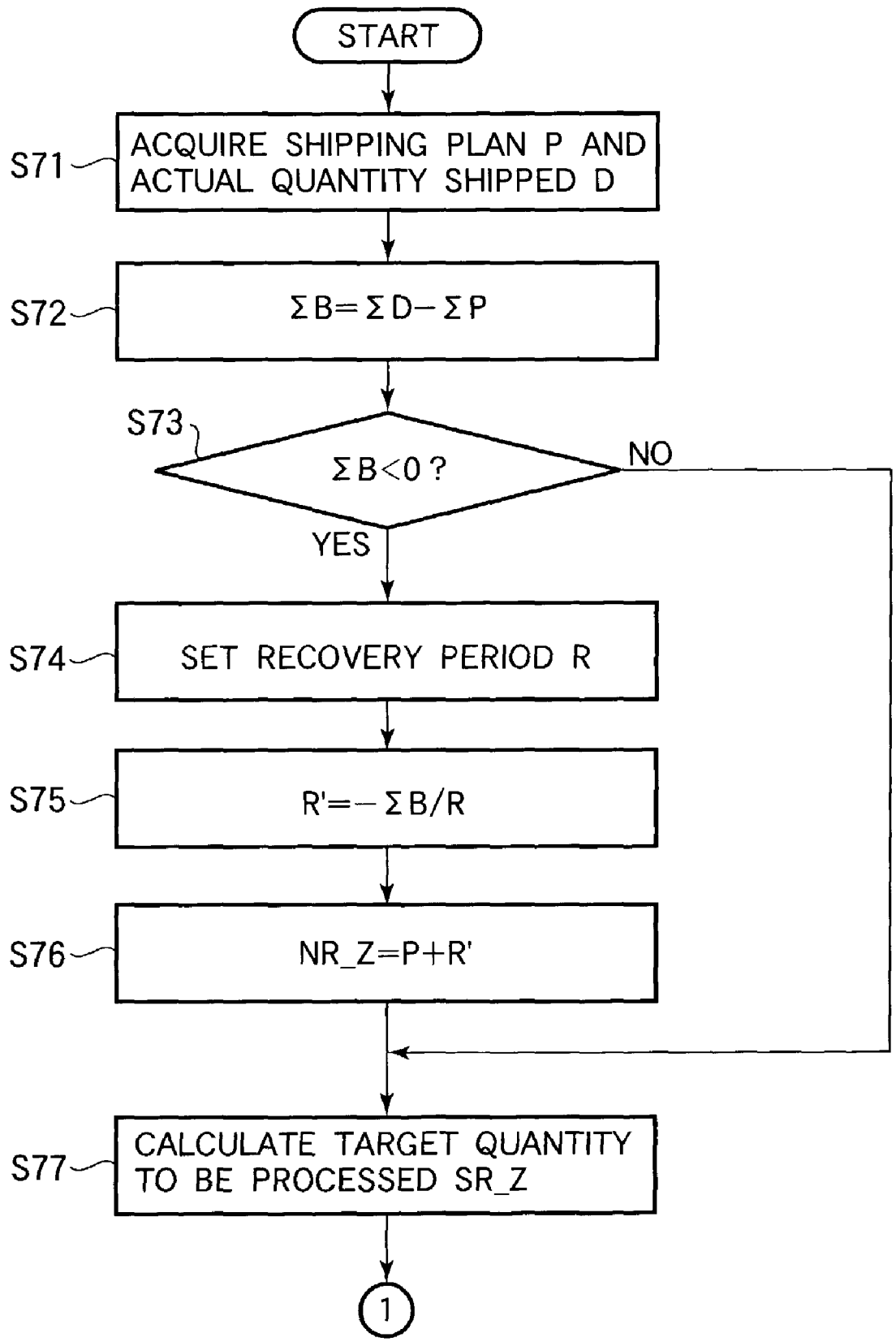
FIG. 13 is a flow chart showing a method of production control according to an eighth embodiment of the invention.

A method of production control according to an eighth embodiment of the invention will now be described with reference to FIGS. 13 to 15. FIGS. 13 and 14 are a flow chart showing a procedure for determining a target quantity to be processed at a product shipping step using the method of production control according to the present embodiment. As shown in FIG. 13, a shipping plan P (a tentative quantity to be processed) created for each control period (for example, day or shift) of each product and the actual quantity shipped D in each control period for each product are acquired first (step S71).

FIG. 15 shows the shipping plan and actual quantity shipped for each of products A and B in each shift. In FIG. 15, the current shift is referred to as "shift n".

Next, a calculation is carried out to obtain a balance (delay) $\Sigma B$ ($=\Sigma D - \Sigma P$) between a cumulative total ($\Sigma P$) of the shipping plan P in each control period and a cumulative total of the actual quantity shipped D for each control period (step S72). In FIG. 15, the balance $\Sigma B$ of the product A up to the preceding shift (n−1) is represented by aa5, and the balance $\Sigma B$ of the product B is represented by ba5.

Then the balance $\Sigma B$ is compared with 0 (step S73). When $\Sigma B$ is smaller than 0 or there is a delay, a period to recover the delay R (a recovery period) is set (step S74). In FIG. 15, a recovery period R for the product A consists of four shifts, and a recovery period R for the product B consists of three shifts.

Next, a quantity to be recovered R' ($=-\Sigma B/R$) in each period is calculated such that the delay is uniformly recovered within a recovery period R, for example (step S75). In FIG. 15, the quantity to be recovered R' for the product A in each period of the shift n is represented by ar1, and the quantities to be recovered R' in the periods of the shifts (n+1), (n+2) and (n+3) are represented by ar2, ar3 and ar4, respectively (ar1+ar2+ar3+ar4=|aa5|). The quantity to be recovered R' for the product B in the period of the shift n is represented by br1, and the quantities to be recovered R' for the periods of the shifts (n+1) and (n+2) are represented by br2 and br3, respectively (br1+br2+br3=|ba5|).

A target for shipment NR_Z within the recovery period R is obtained as the sum of the shipping plan P and the quantity to be recovered R' (step S76). Next, a target quantity to be processed SR_Z is calculated through the procedure shown in FIG. 2 using the target for shipment NR_Z as a tentative quantity to be processed (step S77).

Next, the target quantity to be processed SR_Z and the target for shipment NR_Z are compared (step S78) as shown in FIG. 14. When SR_Z is smaller than NR_Z, the shortage N_NR_Z ($=NR\_Z - SR\_Z$) is calculated (step S79). Next, the shortage N_NR_Z is added to the tentative target quantity to be processed at the next shift (or day) (step S80).

According to the present embodiment, a target quantity to be processed can be set to recover any delay of a shipping plan by adding the delay to be recovered to a tentative target quantity to be processed.

According to the present embodiment, when a tentative target quantity to be processed cannot be achieved, the shortage is added to the tentative target to be processed at the next shift, which makes it possible to set a target quantity to be processed such that work in process can be processed with priority when it reaches a shipping step.

As described above, according to the invention, the quantity of work in process that can be actually processed is reflected in a target quantity to be processed in calculating an optimum ratio of use of each apparatus at each production step such that equal load ratios can be achieved in cumulative processing during an operating period that is the object of a medium-term production plan and reflecting the same in scheduling. This makes it possible to avoid a problem in that a target quantity to be processed cannot be achieved because of shortage of work in process.

Even in the case of an extreme concentration of work in process on any type of products that means a deviation from an optimum ratio of use of each apparatus in the presence of a condition that limits use of apparatus, a target quantity to be processed for each product type can be set to minimize a difference between a tentative total target quantity to be processed and the quantity of products that can be actually processed.

Further, when there is a condition that limits use of apparatus and a production step under the condition limiting use of apparatus is a bottleneck production step, each type of products in a required quantity can be fed with priority from the preceding production step such that a difference between a tentative target quantity to be processed of the product type at the production step and a target quantity to be processed of the same is minimized, which makes it possible to maximize the processing at the bottleneck production step.

On a production line on which product types introduced on a batch basis or discrete basis are mingled with product types introduced continuously, it is possible to efficiently perform a batch process on the product types introduced on a batch basis or discrete basis and to calculate a target quantity to be processed such that each apparatus is used at an optimum ratio at each production step with respect to entire cumulative processes including processes performed on other product types in an operating period that is the object of a medium-term production plan.

What is claimed is:

1. A method of production control for a production line having a plurality of production steps, comprising the steps of:
   setting a tentative target quantity to be processed at a major production step in advance;
   setting the tentative target quantity to be processed as a target quantity to be processed when a quantity of work in process that can be actually processed is equal to or greater than the tentative target quantity to be processed;
   setting a quantity of work in process that can be processed as the target quantity to be processed when the quantity of work in process that can be actually processed is smaller than the tentative target quantity to be processed; and
   controlling the production line based on the target quantity to be processed.

2. A method of production control according to claim 1, wherein the tentative target quantity to be processed is set such that load ratios of a group of production steps that share a group of apparatus and can give and receive capabilities of each other through the sharing of apparatus are leveled between the apparatus or throughout an operating period that is an object of scheduling.

3. A method of production control according to claim 1, wherein the quantity of work in process that can be processed is determined based on either the quantity of work in process within a range of a predetermined number of production steps preceding the major production step or the quantity of work in process in a group of production steps whose lead time up to the major production step is shorter than a range of time for which the target quantity to be processed is set.

4. A method of production control according to claim 1, wherein when the quantity of work in process that can be processed is smaller than the tentative target quantity to be processed at one of a group of production steps that share a group of apparatus and that can give and receive capabilities of each other through the sharing of the apparatus, the quantity of work in process that can be processed is set as the target quantity to be processed, and a quantity of work to be processed equivalent to a difference between the tentative target quantity to be processed and the target quantity to be processed is allocated to another of the group of production steps.

5. A method of production control used for a group of production steps belonging to a production line for two or more product types in the presence of a condition that a history of an apparatus used for processing one product type at one of the production steps limits Processing of one product type at another of the group of production steps to a certain apparatus, the method comprising the steps of:
   categorizing products into product types according to the apparatus used or scheduled to be used at a first production step that places the condition that limits use of the apparatus;
   determining a tentative target quantity to be processed and/or a target quantity to be processed for each of the categorized product types;
   controlling the production line based on the tentative target quantity to be processed and/or the target Quantity to be processed,
   the tentative target quantity to be processed is set for each of the product types at a production step under the condition that limits use of apparatus on an assumption that only one product type flows through the production step and on an assumption that a mixture of the product types flow through the production step; and
   the target quantity to be processed for each product type is determined such that a ratio of the target quantity to be processed of each product type is equal to a ratio of a quantity of work in process that can be actually processed for the product type, such that the sum of the target quantities to be processed of the product types is at a maximum value that is equal to or smaller than the sum of the tentative target quantities to be processed, and such that the target quantity to be processed for each product type is at a maximum value that is equal to or smaller than the tentative target quantity to be processed for the product type.

6. A method of production control according to claim 5, wherein one production step for which both of the tentative target quantity to be processed of each product type and the tentative target quantity to be processed on the assumption of a flow of a mixture, of the product types are set shares a group of apparatus with another production step and wherein the production steps can give and receive capabilities of each other through the sharing of the apparatus, the method comprising the steps of:
   setting the quantity of work in process that can be processed as the target quantity to be processed for each of the product types when the quantity of work in process for the product type is smaller than the tentative target quantity to be processed for the product type at the one production step and allocating a quantity of work to be processed equivalent to a difference between the tentative target quantity to be processed and the target quantity to be processed to the other production step; and
   allocating a quantity of work to be processed equivalent to a difference between the sum of the tentative target quantities to be processed and the sum of the target quantities to be processed of the product types to the other production step when the sum of the target quantities to be processed of the product types is smaller than the sum of the tentative target quantities to be processed.

7. A method of production control used for a group of production steps belonging to a production line for two or more product types in the presence of a condition that a history of an apparatus used for processing one product type at one of the production steps limits processing of one product type at another of the group of production steps to a certain apparatus, the method comprising the steps of:
   categorizing products into product types according to the apparatus used or scheduled to be used at a first production step that places the condition that limits use of the apparatus;
   determining a tentative target quantity to be processed and/or a target quantity to be processed for each of the categorized product types;
   controlling the production line based on the tentative target quantity to be processed and/or the target quantity to be processed, the tentative target quantity to be processed of one product type at one production step is set greater than a quantity of products to form one batch of the product type or a quantity of products that is equal to or smaller than the quantity of products to form a batch and that is obtained by subtracting a quantity of products to form one lot or one unit for transportation as a part of a batch from the quantity of products to form a batch; and
   the tentative target quantity to be processed is set as the target quantity to be processed when a quantity of work in process that can be processed at the production step is equal to or greater than the tentative target quantity to be processed.

8. A method of production control according to claim 7, wherein when the target quantity to be processed cannot be processed at the production step in one processing period, a tentative target quantity to be processed of the product type at the production step in the next processing period is set equal to a quantity of products that have been left unprocessed or set equal to a quantity of remaining products plus the quantity of products to form one batch of the product type or the quantity of products that is equal to or smaller than the quantity of products to form a batch and that is greater than the quantity of products obtained by subtracting the quantity of products to form one lot or one unit for transportation as a part of the batch from the quantity of products to form a batch.

9. A method of production control according to claim 7, wherein:
   the tentative target quantity to be processed is set based on the quantity of products to form a batch at least for one of product types for which the tentative target quantities to be processed are set and the tentative target quantity to be processed is set for each of the other product types on an assumption that only one product type flows through the production step;
   the quantity of work in process for the one product type is reserved as the target quantity to be processed with a priority given to the quantity of work in process that can be actually processed; and
   a remainder of the total of the tentative target quantities to be processed minus the target quantity to be processed of the one product type is distributed to each of the product types such that it is at a maximum value within the tentative target quantity to be processed of the product type.

10. A method of production control for a production line having a plurality of production steps, comprising the steps of:
   setting a tentative target quantity to be processed at a major production step in advance;
   setting the tentative target quantity to be processed as a target quantity to be processed when a quantity of work in process that can be actually processed is equal to or greater than the tentative target quantity to be processed;
   setting a quantity of work in process that can be processed as the target quantity to be processed when the quantity of work in process that can be actually processed is smaller than the tentative target quantity to be processed;
   controlling the production line based on the target quantity to be processed.
   calculating a tentative target quantity to be processed at a shipping step of a production line by determining a quantity to be recovered from a planned cumulative quantity shipped of each product type in a period starting from a day at an end of a production plan until a day to start a calculation of the target quantity to be processed minus the actual cumulative quantity shipped divided by the recovery period and by adding the quantity to be recovered to an initial planned quantity to be shipped in the period from the starting day until the day on which the recovery is scheduled to be completed; and
   calculating the tentative quantity to be processed added with the quantity to be recovered for each product type when a plurality of product types flow on the production line.

11. A method of production control according to claim 10, wherein a target quantity to be processed is calculated by adding a difference between a target quantity to be processed and a tentative target quantity to be processed in one processing period to a tentative target quantity to be processed in the next processing period.

12. A method of manufacturing an electronic apparatus utilizing a method of production control comprising the steps of:
   setting a tentative target quantity to be processed at a major production step in advance;
   setting the tentative target quantity to be processed as a target quantity to be processed when a quantity of work in process that can be actually processed is equal to or greater than the tentative target quantity to be processed;
   setting a quantity of work in process that can be processed as the target quantity to be processed when the quantity of work in process that can be actually processed is smaller than the tentative target quantity to be processed; and
   controlling the production line based on the target quantity to be processed.

* * * * *